(12) United States Patent
Everitt et al.

(10) Patent No.: US 6,455,177 B1
(45) Date of Patent: Sep. 24, 2002

(54) STABILIZATION OF GMR DEVICES

(75) Inventors: Brenda A. Everitt, Minneapolis, MN (US); Arthur V. Pohm, Ames, IA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/454,085

(22) Filed: Dec. 3, 1999

Related U.S. Application Data

(60) Provisional application No. 60/157,877, filed on Oct. 5, 1999.

(51) Int. Cl.[7] .................................................. B32B 9/00
(52) U.S. Cl. ........................ 428/693; 428/617; 428/618
(58) Field of Search ........................ 365/158; 360/113; 324/207, 252; 338/32; 428/693, 617, 618, 619, 621, 629, 652, 667, 671, 651, 679, 699

(56) References Cited

U.S. PATENT DOCUMENTS

| | | | | |
|---|---|---|---|---|
| 5,159,513 A | * | 10/1992 | Dieny et al. ................. | 360/113 |
| 5,206,590 A | * | 4/1993 | Dieny et al. ................. | 324/252 |
| 5,251,170 A | | 10/1993 | Daughton et al. ........... | 365/158 |
| 5,420,819 A | | 5/1995 | Pohm .......................... | 365/158 |
| 5,422,571 A | * | 6/1995 | Gurney et al. ............... | 324/252 |
| 5,496,759 A | | 3/1996 | Yue et al. .................... | 437/52 |
| 5,583,725 A | | 12/1996 | Coffey et al. ................ | 360/113 |
| 5,701,223 A | * | 12/1997 | Fontana, Jr. et al. ........ | 360/113 |
| 5,756,366 A | | 5/1998 | Berg et al. ................... | 437/48 |
| 5,841,692 A | * | 11/1998 | Gallagher et al. .......... | 365/173 |
| 6,097,578 A | * | 8/2000 | Pokhil ......................... | 360/319 |
| 6,153,320 A | * | 11/2000 | Parkin ......................... | 428/693 |
| 6,171,693 B1 | * | 1/2001 | Lubitz et al. ............... | 428/332 |
| 6,353,318 B1 | * | 3/2002 | Sin et al. ..................... | 324/252 |
| 6,362,941 B1 | * | 3/2002 | Gill ............................. | 360/324.11 |

OTHER PUBLICATIONS

A. Pohm, et al., "Narrow, End–on, GMR Read–Head Sensors", Digest of International Conference on Magnetics (INTERMAG), AA–06, Apr. 1996.

J. M. Daughton, "Weakly Coupled GMR Sandwiches", IEEE Trans. Magn. 30, 364 (1994).

\* cited by examiner

*Primary Examiner*—Olik Chaudhuri
*Assistant Examiner*—Laura Schillinger
(74) *Attorney, Agent, or Firm*—Kinney & Lange, P.A.

(57) ABSTRACT

A stabilized GMR device includes a GMR stack having a first and a second edge. Stabilization means are positioned adjacent to the first and the second edge of the GMR stack for stabilizing the GMR stack. The GMR stack includes a first layer of ferromagnetic material and a second layer of ferromagnetic material. A spacer layer is positioned between the first and the second ferromagnetic layers. A buffer layer is positioned adjacent to the first magnetic layer and a cap layer is positioned adjacent to the second ferromagnetic layer. The stabilization means include a first coupler layer positioned adjacent to the first edge of the GMR stack and a second coupler layer positioned adjacent to the second edge of the GMR stack. The stabilization means also include a first ferromagnetic layer positioned adjacent to the first coupler layer and a second ferromagnetic layer positioned adjacent to the second coupler layer.

17 Claims, 4 Drawing Sheets

STABILIZATION OF GMR DEVICES

CROSS-REFERENCE TO RELATED APPLICATION(S)

This application claims the benefit of the filing date of U.S. provisional application Ser. No. 60/157,877 entitled "HARD EDGE FORMATION USING RU," which was filed Oct. 5, 1999.

BACKGROUND OF THE INVENTION

The present invention relates to giant magnetoresitive (GMR) devices and more particularly to means for stabilizing GMR devices.

The edges of a GMR stack must be stabilized to ensure that the magnetization of the edges does not rotate when exposed to an applied field. If the magnetization at the edges of a GMR stack moves during operation, this leads to noise which makes data recovery difficult or impossible. Previously, an oxidation process was used to provide stability. During the oxidation process, material near the edges of a GMR stack is transformed into an oxide, which helps to maintain the stability of the device. The result of oxidizing the material at the device edges appears to be an increase in the coercivity of these regions. The oxide may include some antiferromagnetic components that couple with the device edges, thereby pinning the magnetization of the device edges in a single direction. Additional steps are also typically performed during the oxidation process such as annealing. The annealing may be performed in the presence of a field.

U.S. Pat. No. 5,756,366, entitled "MAGNETIC HARDENING OF BIT EDGES OF MAGNETORESISTIVE RAM" (the '366 patent) describes oxidation of device edges in a magnetoresitive RAM. The '366 patent discloses that the edges 23 of magnetic layers 20' and 24' are cleaned and then oxidized by placing the wafer in an oxygen plasma for a length of time. Several hundred to a thousand angstroms of magnetic material are oxidized as shown by the cross-hatched portions 25 shown in FIG. 6 of the '366 patent. The cross-hatched edge portions 25 are magnetically harder than the inner portion of magnetic layers 20' and 24'. The higher coercivity level of oxidized edge portions 25 acts to prevent bit edge reversal in the final magnetoresistive RAM device.

The prior art, therefore, discloses the transformation of the material at the edges of a device. The prior art does not disclose the deposition of additional layers on the device edges to provide stability. Such additional layers are desirable because they couple strongly with the device edges, and help to ensure that the device's edges do not rotate in the presence of an external field.

BRIEF SUMMARY OF THE INVENTION

A stabilized GMR device according to the present invention includes a GMR stack having a first and a second edge. Stabilization means are positioned adjacent to the first and the second edge of the GMR stack for stabilizing the GMR stack. The GMR stack includes a first layer of ferromagnetic material and a second layer of ferromagnetic material. A spacer layer is positioned between the first and the second ferromagnetic layers. A buffer layer is positioned adjacent to the first magnetic layer and a cap layer is positioned adjacent to the second ferromagnetic layer. The stabilization means include a first coupler layer positioned adjacent to the first edge of the GMR stack and a second coupler layer positioned adjacent to the second edge of the GMR stack. The stabilization means also include a first ferromagnetic layer positioned adjacent to the first coupler layer and a second ferromagnetic layer positioned adjacent to the second coupler layer.

The stabilization means couples strongly anti-parallel to the ferromagnetic layers of the GMR stack, thereby effectively "hardening" the edges of the GMR stack, and making them less susceptible to reversal in an applied field. The stabilization means may be used to stabilize folded VGMR read heads, single VGMR read heads, GMR MRAM devices or other similar devices.

DETAILED DESCRIPTION

Figure 1:
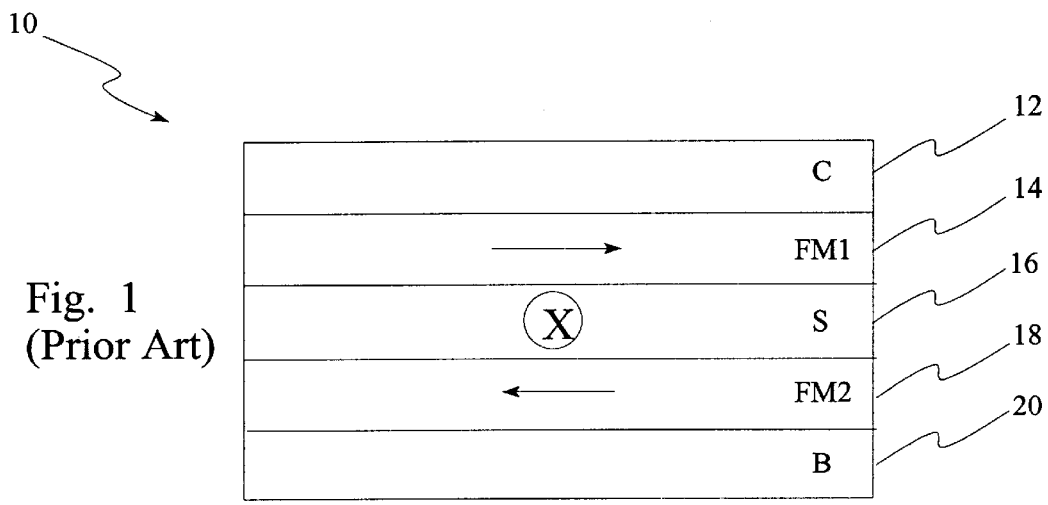
FIG. 1 shows a prior art GMR stack.

FIG. 1 shows a prior art GMR stack 10. GMR stack 10 includes cap layer 12, first ferromagnetic layer 14, spacer layer 16, second ferromagnetic layer 18 and buffer layer 20. Cap layer 12 and buffer layer 20 are preferably Ta, TaN, or NiFeCr. Cap layer 12 and buffer layer 20 may alternatively comprise multilayer structures. Cap layer 12 protects the rest of the layers from oxidation. Buffer layer 20 facilitates an appropriate texture for the films deposited on it. Ferromagnetic layers 14 and 18 may either be a single layer magnetic film or a bi-layer such as NiFeCo/Co, NiFeCo/CoFe, NiFe/Co, NiFe/CoFe, where the Co-rich layer is located at the interface with spacer layer 16 to enhance GMR. Spacer layer 16 is preferably Cu. The configuration of GMR stack shown in FIG. 1 is typically used in a VGMR read head, which is discussed below with respect to FIGS. 5–7.

A bias current is applied to GMR stack 10 in a direction perpendicular to the paper and into GMR stack 10 as represented by the encircled "X" shown on spacer layer 16. The current applied through GMR stack 10 generates a field that acts in opposite directions on each of the two ferromagnetic layers 14 and 18, "scissoring" their magnetizations apart as illustrated by the arrows on these layers. When the magnetizations of ferromagnetic layers 14 and 18 are substantially anti-parallel as shown in FIG. 1, GMR stack 10 is in a high resistance state.

Figure 2:
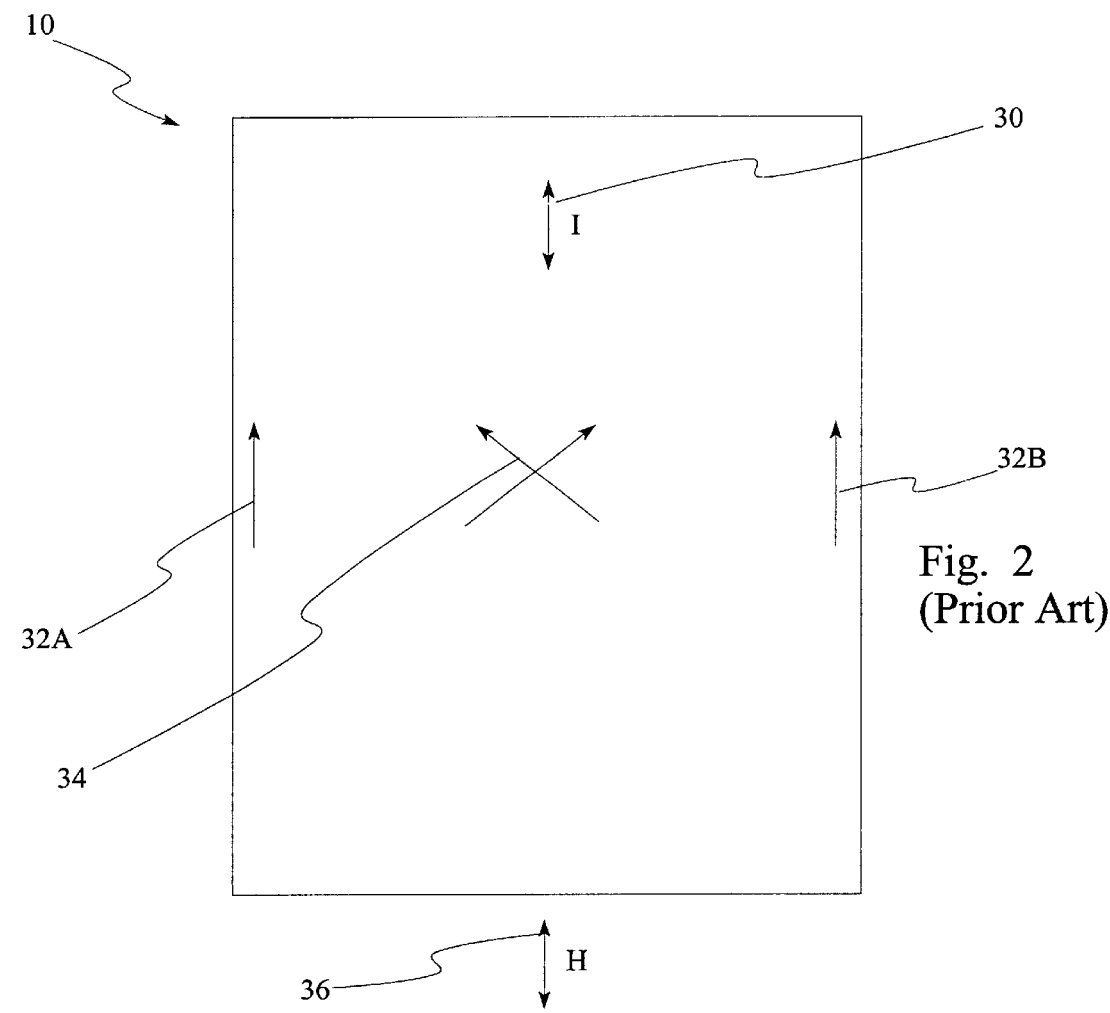
FIG. 2 shows a top view of the GMR stack shown in FIG. 1.

FIG. 2 shows a top view of GMR stack 10. The bias current through GMR stack 10 is represented by arrow 30. Arrow 36 represents the magnetic flux from a magnetic medium. The magnetization in the center of GMR stack 10 is biased or scissored as indicated by crossed arrows 34. In addition to the current running through GMR stack 10, other factors contribute to the bias of the device. For example, the patterning of ferromagnetic layers 14 and 18 leads to a shape anisotropy effect, causing the magnetizations to tend to align longitudinally. Therefore, the magnetizations of ferromagnetic layers 14 and 18 are not exactly anti-parallel, but are scissored as shown by crossed arrows 34. The magnetizations of ferromagnetic layers 14 and 18 are preferably biased about 90 degrees apart. The magnetization near the right and left edges of GMR stack 10 is pinned due to high demagnetization fields. Arrows 32A and 32B represent the magnetization direction at the right and left edges of GMR stack 10.

The center magnetization in GMR stack 10 is the portion that responds to a signal from a magnetic medium. The angle between the magnetizations of ferromagnetic layers 14 and 18 changes based on the polarity of the magnetic flux 36 from a magnetic medium. One polarity will cause the magnetizations to spread farther apart, thereby increasing the resistance of the device. The opposite polarity causes the magnetizations to come closer together, thereby decreasing the resistance. The change in resistance is sensed to determine the data content of the magnetic media. The magnetization at the device edges ideally remains nearly fixed for a stable sensor response. If a high enough field is applied to the device, however, a portion of the edge magnetization will reverse, and the device will become unstable.

Figure 3:
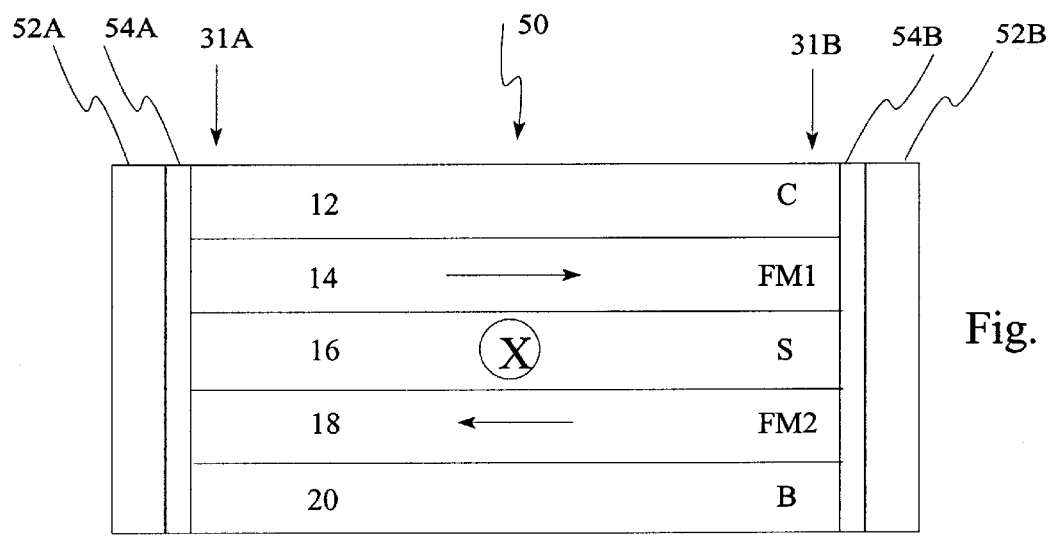
FIG. 3 shows a GMR stack with means for stabilization according to the present invention.

FIG. 3 shows GMR stack 50, which includes means for stabilization according to the present invention. GMR stack 50 includes cap layer 12, first ferromagnetic layer 14, spacer layer 16, second ferromagnetic layer 18 and buffer layer 20. Coupler layers 54A and 54B (collectively referred to as coupler layers 54) are deposited on first edge 31A and second edge 31B, respectively, of GMR stack 50. Coupler layers 54 are preferably a strong anti-parallel coupler material such as Ru. Alternative materials for coupler layers 54 include copper, gold, silver and iridium, but Ru has the strongest anti-parallel coupling properties. Coupler layers 54 are preferably about 4–15 Å thick. Ferromagnetic layers 52A and 52B (collectively referred to as ferromagnetic layers 52) are deposited adjacent to coupler layers 54A and 54B, respectively. Ferromagnetic layers 52 are preferably one of Co, NiFe, NiFeCo, or combinations of these materials. Ferromagnetic layers 52 are preferably about 20–100 Å thick.

Figure 4:
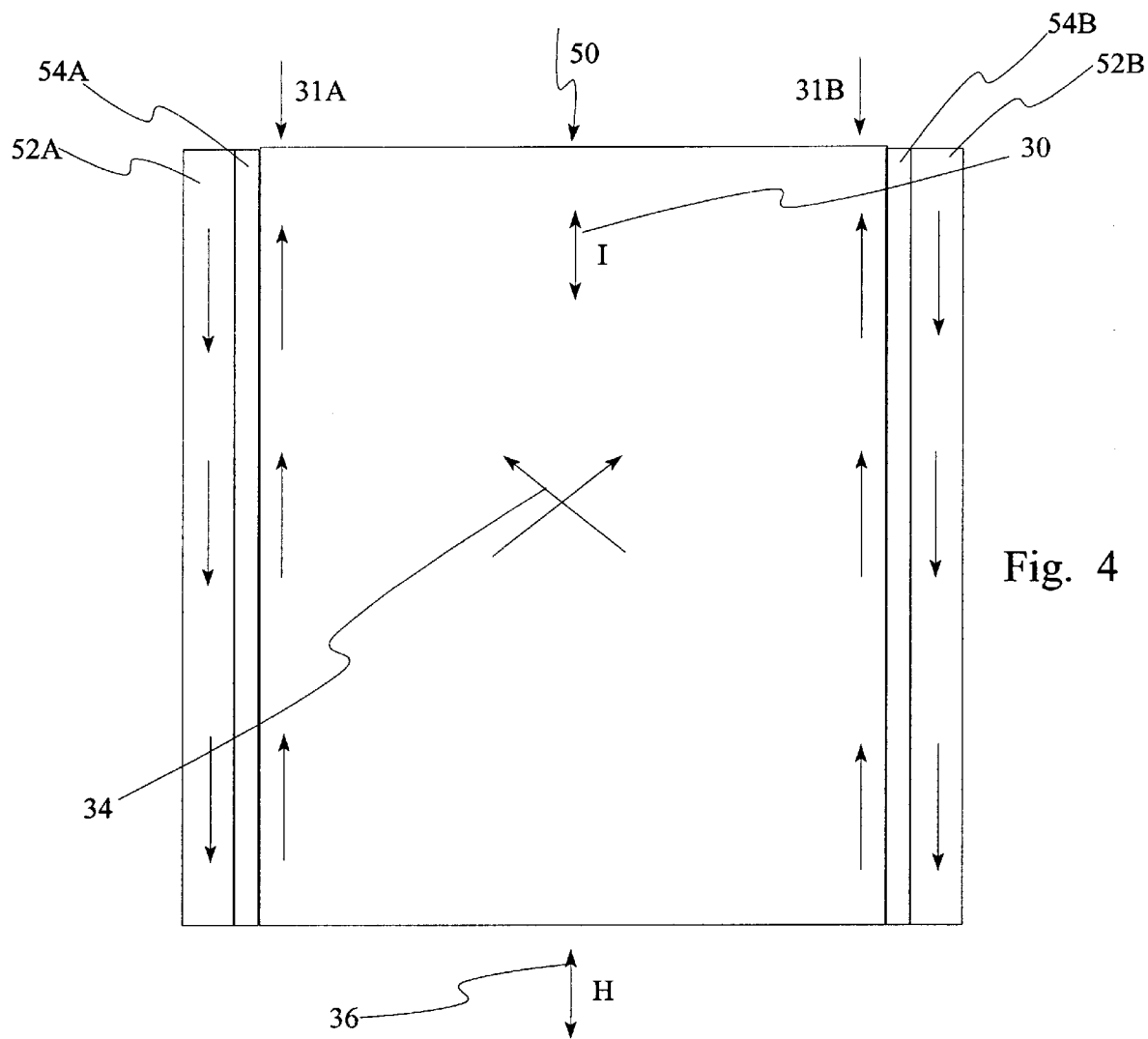
FIG. 4 shows a top view of the GMR stack shown in FIG. 3 including means for stabilization according to the present invention.

For certain values of the thickness of coupler layers 54A and 54B, the magnetizations of ferromagnetic layers 52A and 52B will couple strongly anti-parallel to that of ferromagnetic layers 14 and 18 near the device edges 31A and 31B as shown in FIG. 4. FIG. 4 shows a top view of GMR stack 50, including means for stabilization according to the present invention. The anti-parallel coupling between ferromagnetic layers 52A–52B and GMR stack 50 at device edges 31A and 31B is represented in FIG. 4 by arrows on these regions. The coupling effectively "hardens" the edges 31A and 31B of GMR stack 50, making them less susceptible to reversal in an applied field, and increasing the stability of the device.

Deposition of ferromagnetic layers 52 and coupler layers 54 occurs after GMR stack 50 is patterned. Deposition of ferromagnetic layers 52 and coupler layers 54 on the edges of GMR stack 50 can be accomplished by a technique such as sputtering or ion beam deposition at a high angle. The field area is then etched directional in a self-aligned process to leave material selectively on the high angle sidewalls.

Figure 5:
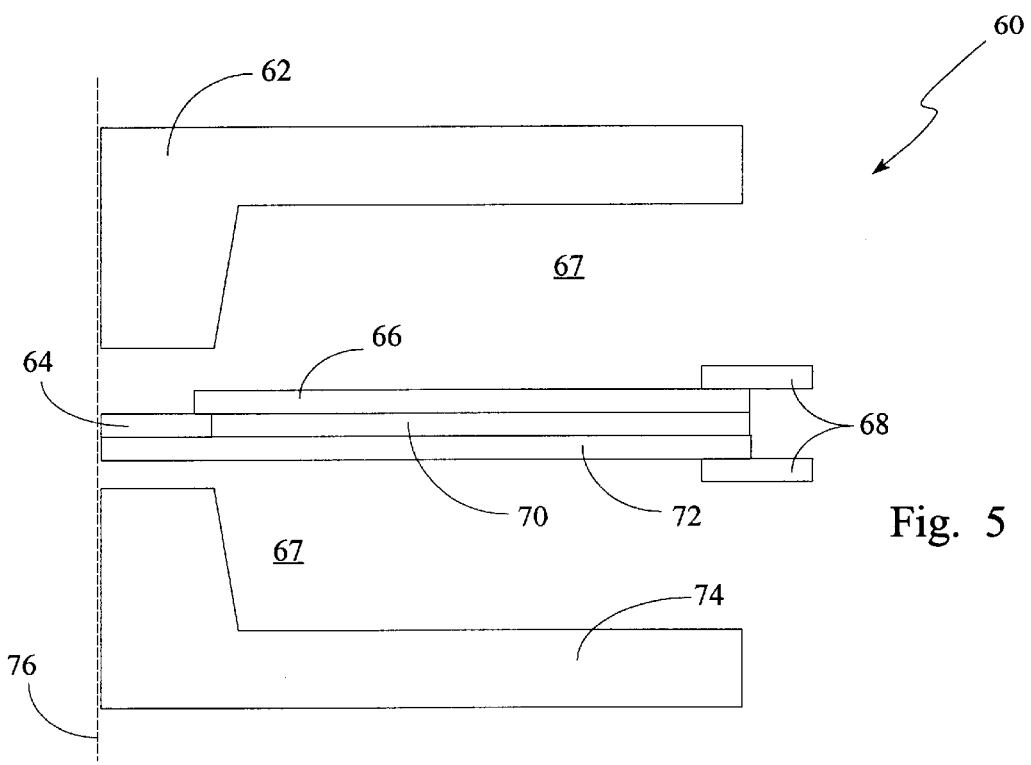
FIG. 5 shows a cross sectional view of a first embodiment of a folded VGMR read head.
Figure 6:
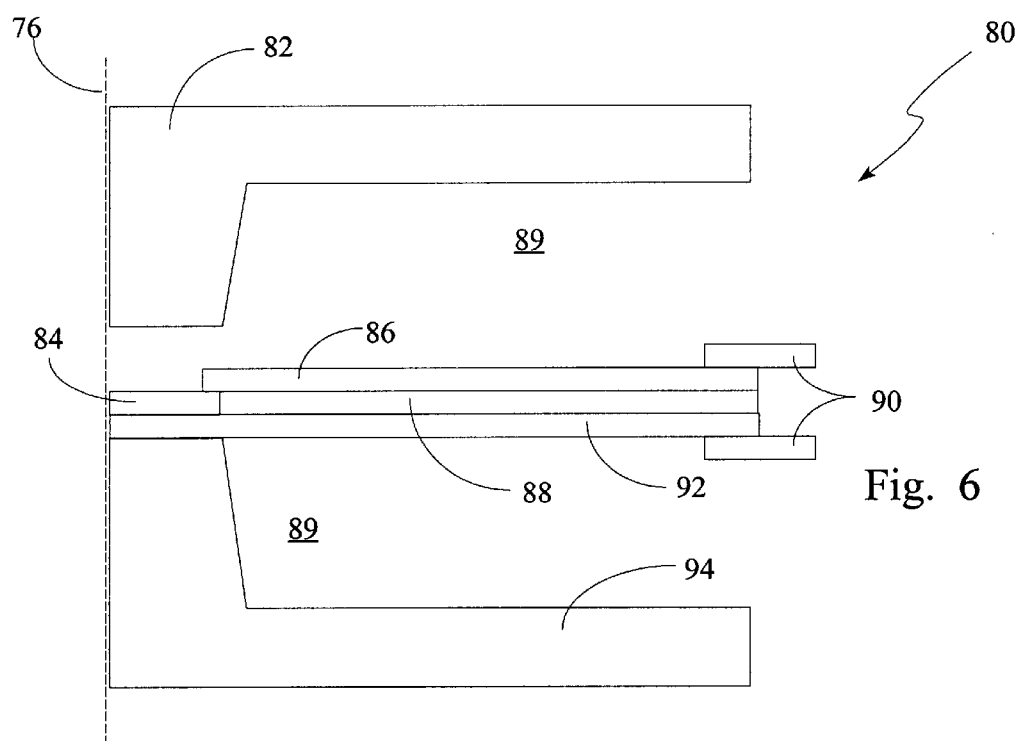
FIG. 6 shows a cross sectional view of second embodiment of a folded VGMR read head.
Figure 7:
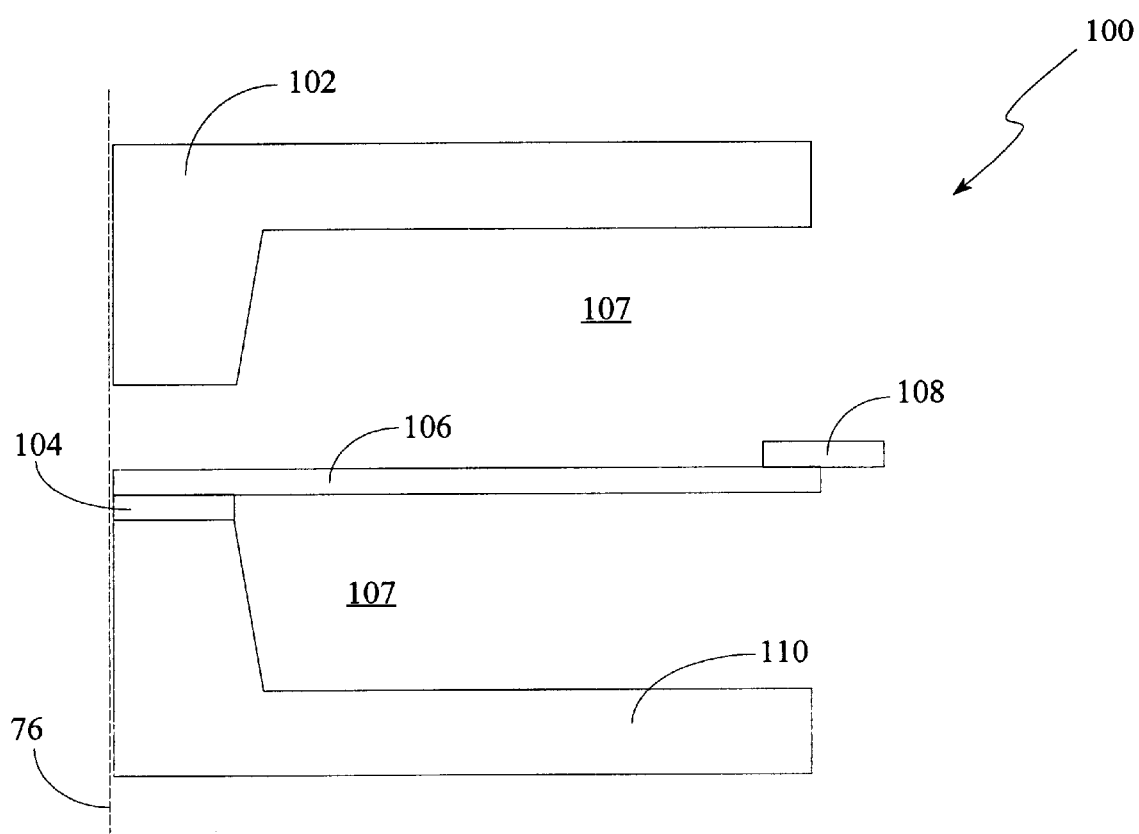
FIG. 7 shows a cross sectional view of single VGMR read head.

The stabilization technique of the present invention may be used in single and folded vertical GMR (VGMR) read heads, such as those illustrated in FIGS. 5–7. FIG. 5 shows a cross-sectional view of a first embodiment of a folded VGMR read head. VGMR read head 60 includes top shield 62, conductor 64, second GMR stack 66, gap material 67, back contacts 68, spacer 70, first GMR stack 72 and bottom shield 74. Conductor 64 may be a continuation of second GMR stack 66. GMR stacks 66 and 72 are separated by spacer 70. Spacer 70 is preferably silicon nitride, although other dielectric materials with a high breakdown voltage may be used. Shields 62 and 74 are recessed away from GMR stacks 66 and 72, and separated therefrom by gap material 67. Gap material 67 is preferably alumina or silicon nitride.

The air bearing surface (ABS) 76 is also shown in FIG. 5. For a VGMR read head, the current runs through the device perpendicular to the ABS. GMR stacks 66 and 72 are configured in a folded structure. First GMR stack 72 has a resistance R1 and second GMR stack 66 has a resistance R2. R1 and R2 respond in the same sense to an applied field. Contact is made to GMR stacks 66 and 72 independently at the back of read head 60 by back contacts 68. Read head 60 may be either a two or three contact device. Current flows from one of back contacts 68, through second GMR stack 66, through conductor 64, and back through first GMR stack 72 to a second one of back contacts 68. First GMR stack 72 and second GMR stack 66 are essentially two resistors in series, which results in a higher resistivity and higher output signal than a parallel GMR stack configuration or a single GMR stack configuration.

FIG. 6 shows a cross-sectional view of a second embodiment of a folded VGMR read head. Read head 80 includes top shield 82, front contact 84, second GMR stack 86, spacer 88, gap material 89, back contacts 90, first GMR stack 92 and bottom shield 94. First GMR stack 92 has resistance R1 and second GMR stack 86 has resistance R2. R1 and R2 respond in opposite senses to an applied field. GMR stacks 86 and 92 are shorted at ABS 76 and grounded. A differential signal is sensed in read head 80 as in a dual stripe magnetoresistive (DSMR) head. An advantage of using a differential signal approach is that it provides common mode noise rejection. Therefore, thermal asperities that would normally cause a sensor to heat up and produce a large signal would be rejected using the differential signal approach.

FIG. 7 shows a cross-sectional view of a single VGMR read head. Read head 100 includes top shield 102, front contact 104, GMR stack 106, gap material 107, back contact 108 and bottom shield 110. In addition to being in electrical contact with GMR stack 106, front contact 104 also makes contact with bottom shield 110. Alternatively, front contact 104 could be in electrical contact with top shield 102. Read head 100 is a less complex design than read heads 60 and 80, and is easier to build. The use of a single GMR stack results in lower resistance, a lower signal, and lower noise than a dual GMR stack design.

For GMR stacks 66, 72, 86, 92 and 106 shown in FIGS. 5–7, the stabilization layers (i.e., ferromagnetic layers 52 and coupler layers 54) are deposited in such a way as to coat the sidewalls of the patterned GMR stacks. The device sidewalls lie substantially parallel to the paper. In addition to stabilizing VGMR read heads, the stabilization technique of the present invention may also be used to stabilize other devices such as GMR MRAM (GMR magnetoresistive access memory) or magnetic field sensors.

Although the present invention has been described with reference to preferred embodiments, workers skilled in the art will recognize that changes may be made in form and detail without departing from the spirit and scope of the invention.

What is claimed is:

1. A stabilized GMR device comprising:
 a GMR stack having a first ferromagnetic layer having first and second edges and a second ferromagnetic layer having first and second edges; and stabilization means on the first edges of the first ferromagnetic layer and the second ferromagnetic layer and on the second edges of the first ferromagnetic layer and the second ferromagnetic layer for stabilizing the GMR stack.

2. The GMR device of claim 1 wherein the GMR stack comprises:
   a spacer layer positioned between the first and second ferromagnetic layers;
   a buffer layer positioned adjacent to the first ferromagnetic layer; and
   a cap layer positioned adjacent to the second ferromagnetic layer.

3. The GMR device of claim 1 wherein the stabilization means comprises:
   a first coupler layer positioned adjacent to the first edges of the first ferromagnetic layer and the second ferromagnetic layer;
   a second coupler layer positioned adjacent to the second edges of the first ferromagnetic layer and the second ferromagnetic layer;
   a first stabilizing ferromagnetic layer positioned adjacent to the first coupler layer; and
   a second stabilizing ferromagnetic layer positioned adjacent to the second coupler layer.

4. The GMR device of claim 3 wherein the first and the second coupler layers are Ru.

5. The GMR device of claim 3 wherein the first and the second stabilizing ferromagnetic layers are one of Co, NiFe, and NiFeCo.

6. The GMR device of claim 3 wherein the first and the second stabilizing ferromagnetic layers are bi-layers comprising two of Co, NiFe, and NiFeCo.

7. The GMR device of claim 3 wherein the first and the second coupler layers are of a thickness to allow the first stabilizing ferromagnetic layer to couple anti-parallel with the first edges of the first and second ferromagnetic layers, and to allow the second stabilizing ferromagnetic layer to couple anti-parallel with the second edges of the first and second ferromagnetic layers.

8. The GMR device of claim 7 wherein the first and the second coupler layers are about 4 to about 15 angstroms thick.

9. The GMR device of claim 7 wherein the first and the second stabilizing ferromagnetic layers are about 20 to about 100 angstroms thick.

10. A GMR stack comprising:
    a first ferromagnetic layer having first and second edges;
    a second ferromagnetic layer having first and second edges;
    a spacer layer positioned between the first and second ferromagnetic layers;
    a first coupler layer positioned adjacent to the first edges of the first ferromagnetic layer and the second ferromagnetic layer;
    a second coupler layer positioned adjacent to the second edges of the first ferromagnetic layer and the second ferromagnetic layer;
    a first stabilizing ferromagnetic layer positioned adjacent to the first coupler layer; and
    a second stabilizing ferromagnetic layer positioned adjacent to the second coupler layer.

11. The GMR stack of claim 10 and further comprising:
    a buffer layer positioned adjacent to the first ferromagnetic layer; and
    a cap layer positioned adjacent to the second ferromagnetic layer.

12. The GMR stack of claim 10 wherein the first and the second coupler layers are Ru.

13. The GMR stack of claim 10 wherein the first and the second stabilizing ferromagnetic layers are one of Co, NiFe, and NiFeCo.

14. The GMR stack of claim 10 wherein the first and the second stabilizing ferromagnetic layers are bi-layers comprising two of Co, NiFe, and NiFeCo.

15. The GMR stack of claim 10 wherein the first and the second coupler layers are of a thickness to allow the first stabilizing ferromagnetic layer to couple anti-parallel with the first edges of the first and second ferromagnetic layers, and to allow the second stabilizing ferromagnetic layer to couple anti-parallel with the second edges of the first and second ferromagnetic layers.

16. The GMR stack of claim 13 wherein the first and the second coupler layers are about 4 to about 15 angstroms thick.

17. The GMR stack of claim 13 wherein the first and the second stabilizing ferromagnetic layers are about 20 to about 100 angstroms thick.

* * * * *